(12) United States Patent
Muzzetto et al.

(10) Patent No.: US 12,094,533 B2
(45) Date of Patent: Sep. 17, 2024

(54) MEMORY CELL READ OPERATION TECHNIQUES

(71) Applicant: Micron Technology, Inc., Boise, ID (US)

(72) Inventors: Riccardo Muzzetto, Arcore (IT);
Francesco Mastroianni, Melzo (IT);
Ferdinando Bedeschi, Biassono (IT);
Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 236 days.

(21) Appl. No.: 17/877,613

(22) Filed: Jul. 29, 2022

(65) Prior Publication Data

US 2024/0038301 A1    Feb. 1, 2024

(51) Int. Cl.
*G11C 11/00*    (2006.01)
*G11C 13/00*    (2006.01)

(52) U.S. Cl.
CPC ........ *G11C 13/004* (2013.01); *G11C 13/0004* (2013.01); *G11C 2013/0057* (2013.01)

(58) Field of Classification Search
CPC ............ G11C 11/4096; G11C 11/4085; G11C 11/4091; G11C 2213/71; G11C 13/0028; G11C 13/0061; G11C 13/004; G11C 13/0004; G11C 2013/0057; G11C 11/5642
See application file for complete search history.

(56) References Cited

U.S. PATENT DOCUMENTS

| 2019/0013058 A1* | 1/2019 | Muzzetto | G11C 11/221 |
| 2020/0194063 A1* | 6/2020 | El Gamal | G11C 11/5642 |
| 2022/0139474 A1* | 5/2022 | Lee | G11C 16/3463 365/185.22 |
| 2023/0282270 A1* | 9/2023 | Bolandrina | G11C 11/4082 |

* cited by examiner

*Primary Examiner* — Hien N Nguyen
(74) *Attorney, Agent, or Firm* — Holland & Hart LLP

(57) ABSTRACT

Methods, systems, and devices for memory cell read operation techniques are described. A memory device may determine a starting voltage for a second phase of a read operation for a set of memory cells which may have a different magnitude than a magnitude of a starting voltage of a first phase of the read operation. For example, the memory device may use an ending voltage of the first phase to determine the starting voltage for the second phase. In some cases, the starting voltage for the second phase may correspond to a difference of a voltage offset and the ending voltage of the first phase. As part of the second phase of the read operation, the memory device may apply a sequence of voltages to the set of memory cells in accordance with the determined starting voltage of the second phase.

25 Claims, 7 Drawing Sheets

SECTION A-A

Unselected Memory Cell 105   ■ Selected Memory Cell 105-a

MEMORY CELL READ OPERATION TECHNIQUES

FIELD OF TECHNOLOGY

The following relates to one or more systems for memory, including memory cell read operation techniques.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
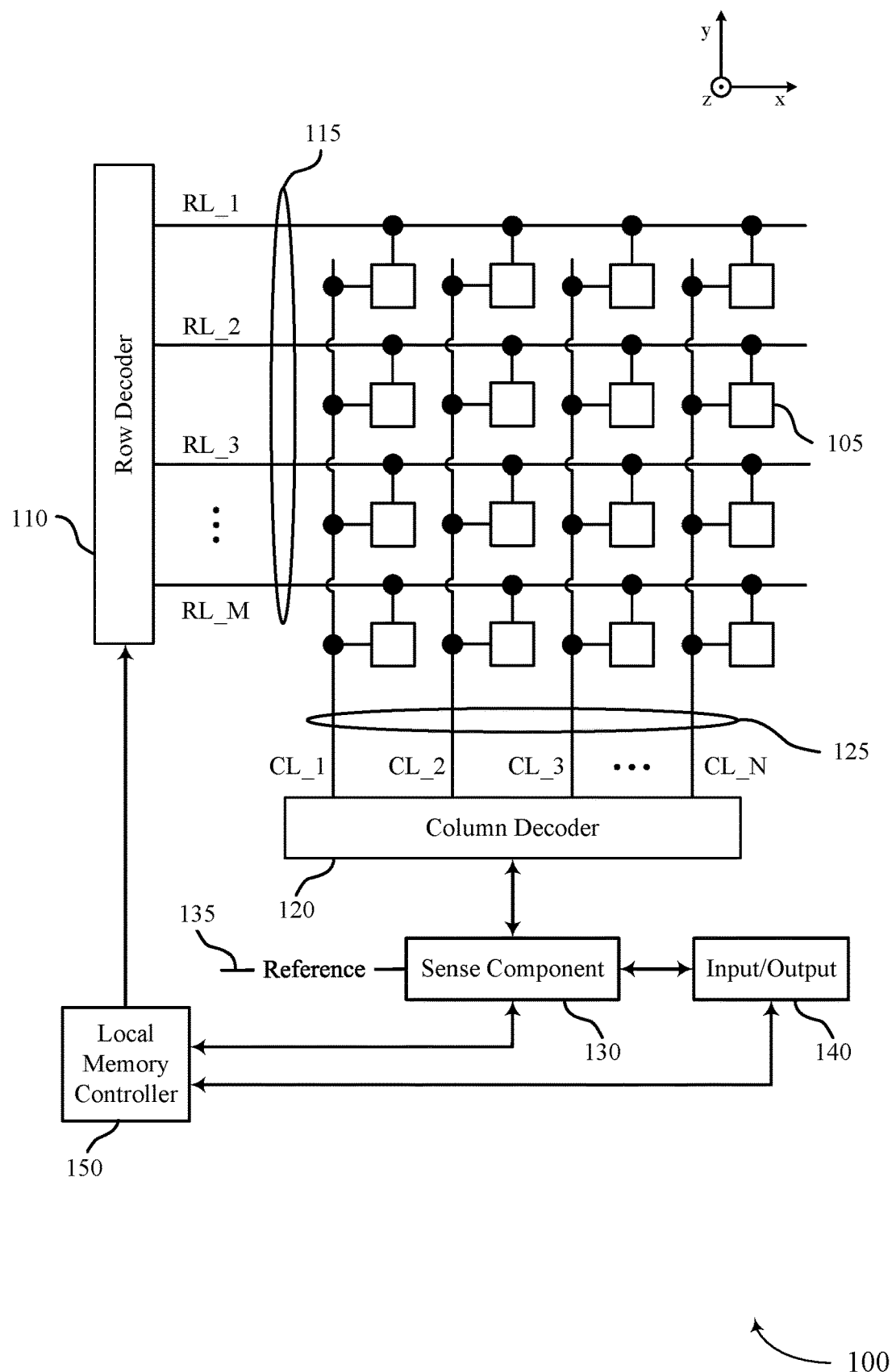
FIG. 1 illustrates an example of a memory array that supports memory cell read operation techniques in accordance with examples as disclosed herein.

Some memory devices may include multi-level memory cells configured to store one of multiple (e.g., three or more) supported logic states, such as ternary memory cells configured to store one of three logic states, among other types of multi-level memory cells. Each supported logic state may correspond to a respective threshold voltage of a memory cell. In some cases, a magnitude of a threshold voltage of a memory cell storing a given logic state may depend on a polarity a voltage applied to the memory cell. Such polarity dependency of the threshold voltages may be leveraged to support a read operation for a set of memory cells that includes two phases. For instance, in an example of reading a set of ternary memory cells, during the first phase, a first sequence of voltages with increasing magnitudes of the first polarity may be applied to the set of memory cells to determine a first subset of memory cells storing a first logic state (e.g., based on the first subset of ternary memory cells activating in response to the application of the first sequence of voltages). During the second phase, a second sequence of voltages with increasing magnitudes of the second polarity may be applied to the set of memory cells to determine a second subset of memory cells storing a second logic state (e.g., based on the second subset of ternary memory cells activating in response to the application of the second sequence voltages). A third subset of remaining memory cells that are not activated in response to the application of the first or second sequence of voltages may be determined to store a third logic state. Thus, the logic states stored by each of the memory cells may be determined during a two phase read operation.

In some examples, the threshold voltages corresponding to the logic states of the memory cells may however drift over time. As a result latency associated with the read operation may increase, for example, as the quantity of voltages included in the sequences of voltages (e.g., the quantity of steps) increases to account for the drifted threshold voltages (e.g., to activate the respective subsets of memory cells). Accordingly, techniques to improve efficiency and latency of read operations are desired.

As described herein, a memory device may determine a starting voltage (e.g., $V_{init}(NEG)$) of a sequence of voltages for the second phase of a two-phase read operation which may have a different magnitude than a magnitude of a starting voltage of a sequence of voltages for the first phase of the two-phase read operation (e.g., $V_{init}(POS)$). For example, the memory device may use an ending voltage of the sequence of voltages for the first phase (e.g., $V_{stop}(POS)$, a last voltage of the sequence of voltages for the first phase) to determine the starting voltage for the second phase of the read operation. In some cases, a magnitude of the starting voltage for the second phase may be based on or correspond to (e.g., equal) a difference of a voltage offset and the ending voltage of the first phase (e.g., $V_{init}(NEG)=-(V_{stop}(POS)-V_{offset})$). Thus, the starting voltage for the second phase may not be based on or not correspond to the negative (e.g., opposite) of the starting voltage of the first phase and may instead be based on the ending voltage of the first phase. Due to the starting voltages having different magnitudes, the second phase of the read operation may include fewer voltage steps, which may in turn reduce read operation latency. For example, using a larger magnitude starting voltage for the second phase may result in fewer steps used to reach the end of a threshold voltage distribution associated with reading the second logic state during the second phase. Thus, a quantity of voltages included in the sequence of voltages for the second phase may be reduced, thereby reducing read operation latency.

Features of the disclosure are initially described in the context of memory devices and arrays with reference to FIGS. 1, 2, 3A, and 3B. Features of the disclosure are described in the context of a voltage diagram and a system with reference to FIGS. 4 through 5. These and other features of the disclosure are further illustrated by and described with reference to an apparatus diagram and flowcharts that relate to memory cell read operation techniques as described with reference to FIGS. 6 through 7.

FIG. 1 illustrates an example of a memory device 100 that supports memory cell read operation techniques in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

The memory device 100 may include any quantity of non-transitory computer readable media that support memory cell read operation techniques. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

In accordance with examples disclosure herein, the memory device 100 may perform a two-phase read operation to read a set of memory cells 105. In accordance with examples described herein, the memory device 100 may determine a starting voltage of a sequence of voltages for a second phase of the two-phase read operation which may have a different magnitude than a magnitude of a starting voltage of a sequence of voltages for a first phase of the read operation. For example, the memory device 100 may use an ending voltage of the sequence of voltages for the first phase to determine the starting voltage for the second phase. In some cases, a magnitude of the starting voltage for the second phase may correspond to (e.g., equal) a difference of a voltage offset and the ending voltage of the first phase. Thus, the starting voltage for the second phase may not correspond to the negative of the starting voltage of the first phase and may instead be based on the ending voltage of the first phase. Due to the starting voltages having different magnitudes, the second phase of the read operation may include fewer voltage steps, which may in turn reduce read operation latency. For example, using a larger magnitude starting voltage for the second phase may result in fewer steps used to reach the end of a threshold voltage distribution associated with reading a logic state during the second phase.

Figure 2:
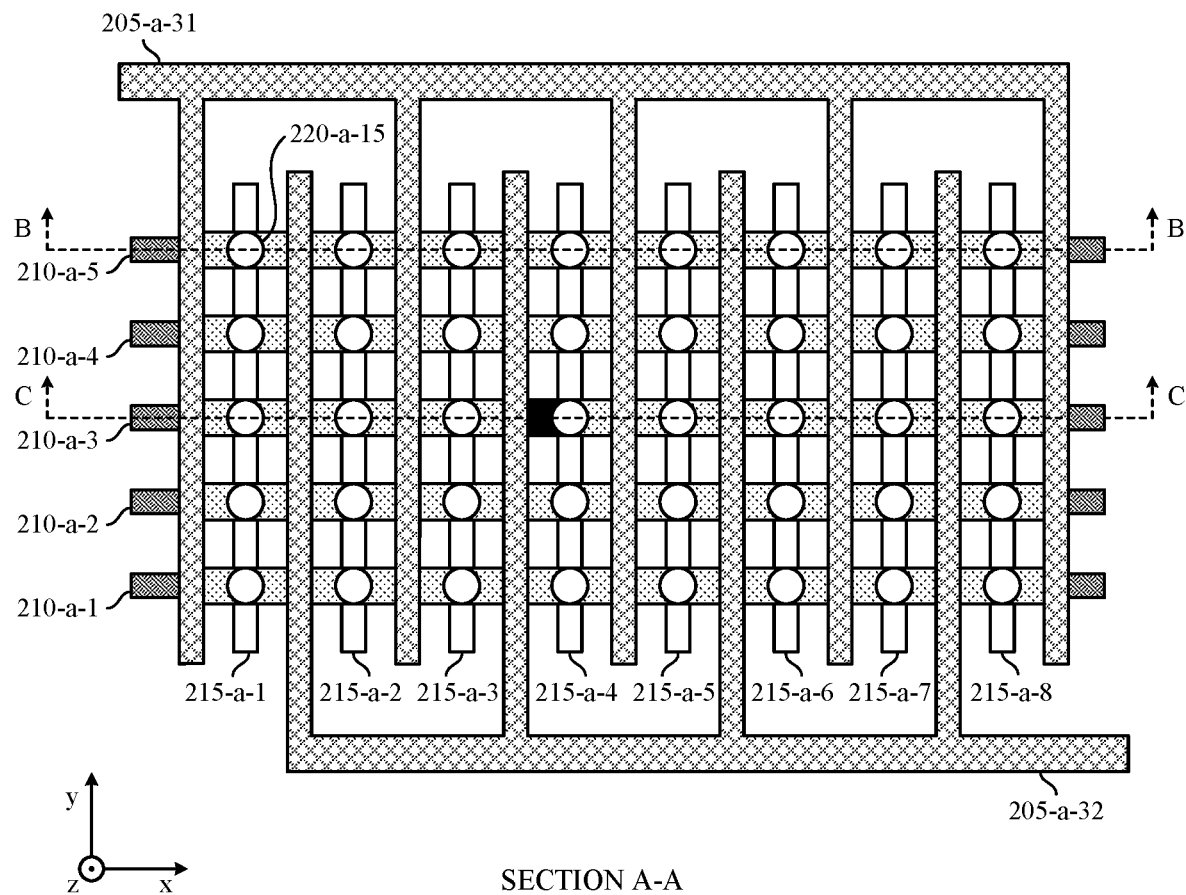
FIG. 2 illustrates a top view of an example of a memory array that supports memory cell read operation techniques in accordance with examples as disclosed herein.
Figure 3A:
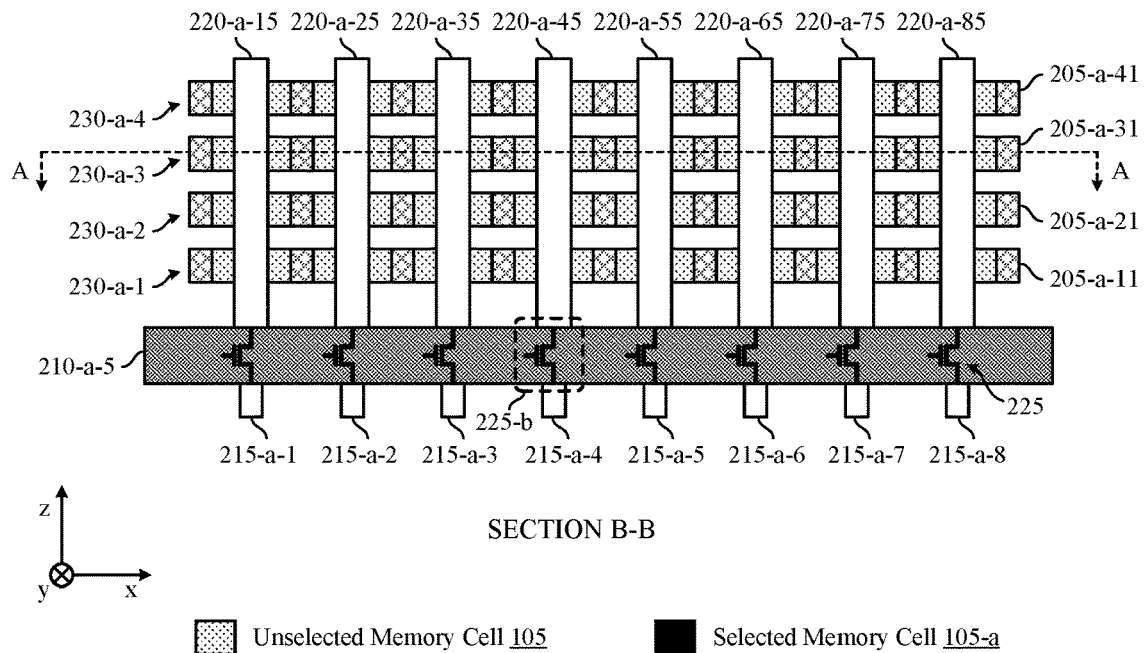
FIGS. 3A and 3B illustrate side views of examples of a memory array that supports memory cell read operation techniques in accordance with examples as disclosed herein.
Figure 3B:
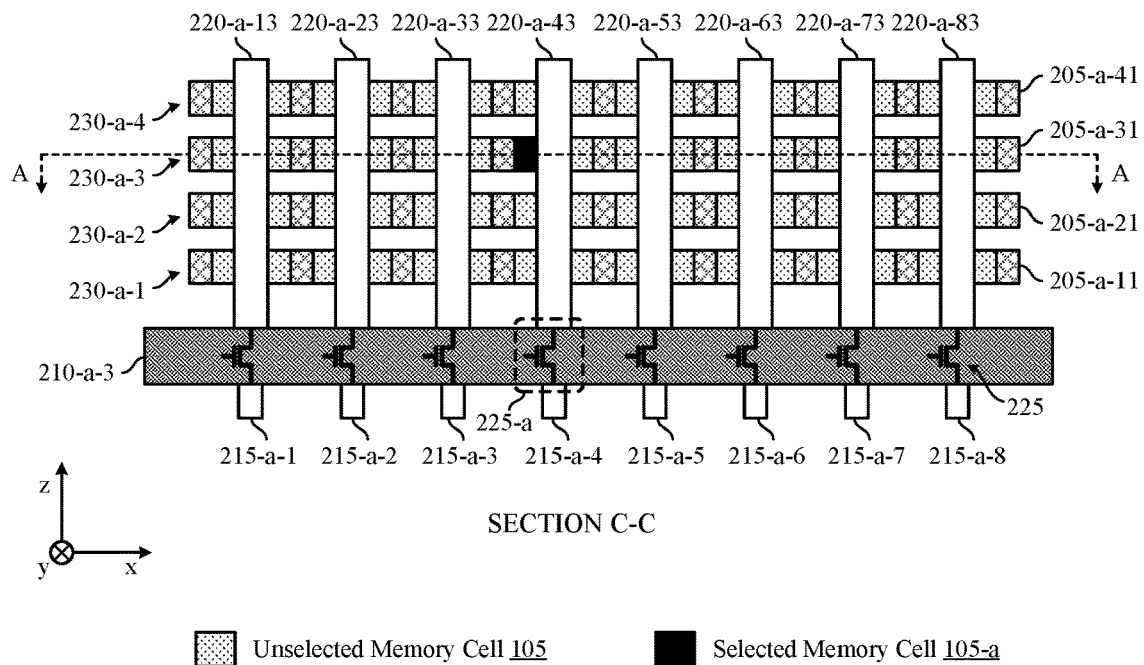

FIGS. 2, 3A, and 3B illustrate an example of a memory array 200 that supports memory cell read operation techniques in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-a-43, the sense line 215-a-4 may be biased with the access bias, and the gate line 210-a-3 may be grounded (e.g., biased to 0V) or otherwise biased with an activation voltage. In an example where the transistors 225 are n-type transistors, the gate line 210-a-3 being biased with a voltage that is relatively higher than the sense line 215-a-4 may activate the transistor 225-a (e.g., cause the transistor 225-a to operate in a conducting state), thereby coupling the pillar 220-a-43 with the sense line 215-a-4 and biasing the pillar 220-a-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-a is activated, or may be coupled with another voltage source (e.g., grounded, via a high-resistance path, via a leakage path) to avoid a voltage drift of the pillars 220. For example, a ground voltage being applied to the gate line 210-a-3 may not activate other transistors coupled with the gate line 210-a-3, because the ground voltage of the gate line 210-a-3 may not be greater than the voltage of the other sense lines 215 (e.g., which may be biased with a ground voltage or may be floating). Further, other unselected gate lines 210, including gate line 210-a-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-b coupled with the gate line 210-a-5 may be deactivated (e.g., operating in a non-conductive state), thereby isolating the voltage of the sense line 215-a-4 from the pillar 220-a-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

The memory array 200 may support reading the logic states of a set of selected memory cells 105. For example, the memory array 200 may support a two-phase read operation in which a first sequence of read biases having a first polarity may be applied across a set of ternary memory cells 105 during a first phase of the read operation and a second sequence of read biases having a second polarity may be applied across the set of ternary memory cells 105 during a second phase of the read operation. Ternary memory cells 105 that threshold in response to the application of a read bias of the first sequence of read biases may be determined to store a first logic state, and ternary memory cells 105 that threshold in response to the application of a read bias of the second sequence of read biases may be determined to store a second logic state. Ternary memory cells 105 that do not threshold in response to application of either the first sequence of read biases or the second sequence of read biases may be determined to store a third logic state. Thus, the logic states stored by each of the ternary memory cells 105 may be determined based on applying the first sequence and the second sequence of read biases across the ternary memory cells 105.

In accordance with examples disclosed herein, circuitry associated with the memory array 200 may determine a starting read bias of the second sequence of read biases for the second phase of the read operation such that the starting read bias has a different magnitude than a magnitude of a starting read bias of the first sequence of read biases for the first phase of the read operation. For example, the circuitry may identify an ending read bias of the first sequence of read biases and determine the starting read bias for the second sequence of read biases based on the ending read bias. In some cases, a magnitude of the starting read bias for the second sequence of read biases may equal a difference of a voltage offset and the ending read bias of the first sequence of read biases. Thus, the starting read bias for the second sequence of read biases may not correspond to the negative of the starting read bias of the first sequence of read biases and may instead be based on the ending voltage of the first sequence of read biases. Due to determining the starting read bias of the second read biases based on the ending read bias, the second sequence of read biases may include fewer read biases that the first sequence of read biases, which may in turn reduce read operation latency. For example, the magnitude of the starting read bias of the second sequence of read biases may be larger than the magnitude of the starting read bias of the first sequence of read biases, which may result in fewer steps used to reach the end of a threshold voltage distribution associated with reading the second logic state during the second phase.

Figure 4:
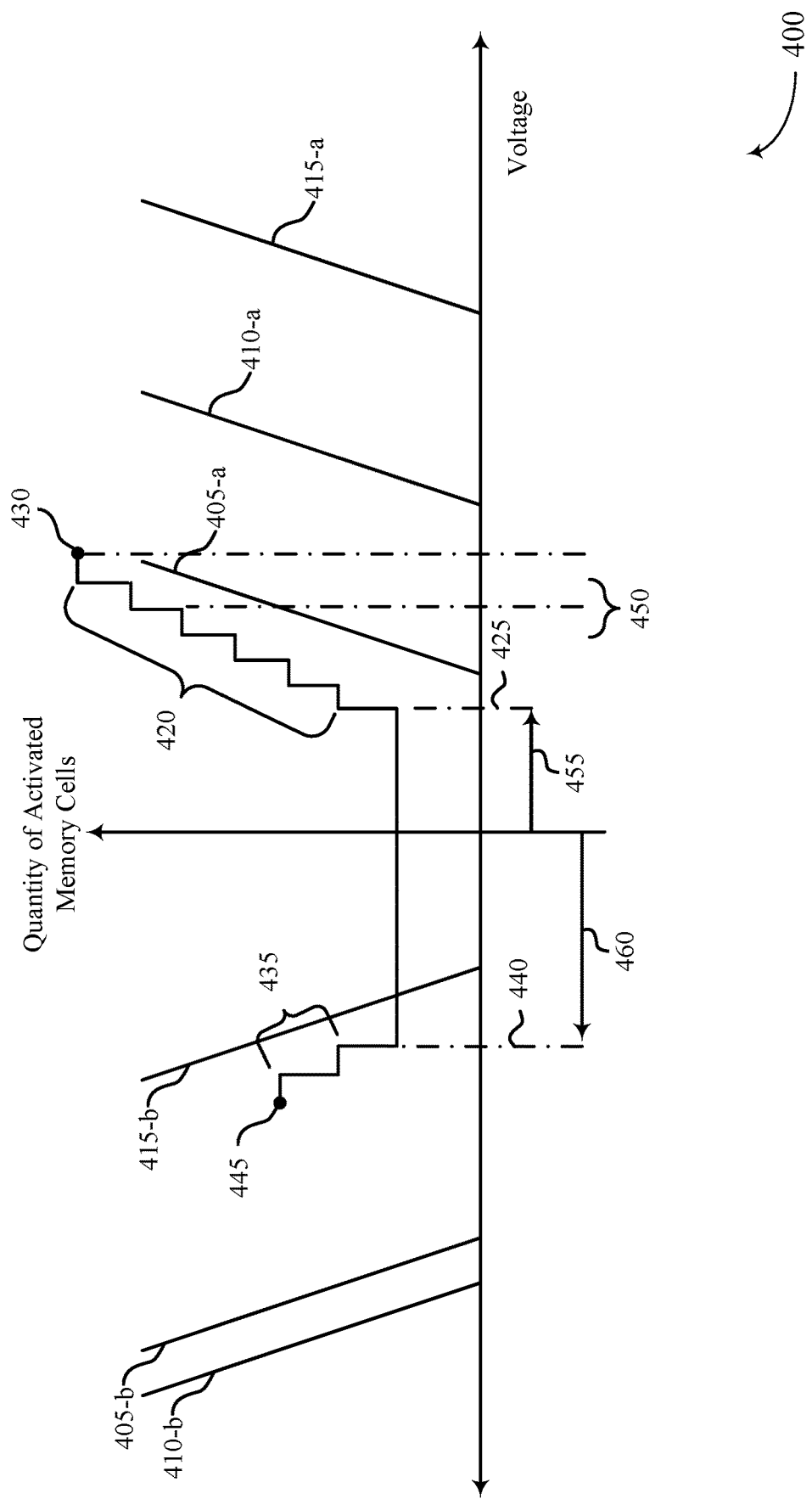
FIG. 4 illustrates an example of a voltage diagram that supports memory cell read operation techniques in accordance with examples as disclosed herein.

FIG. 4 illustrates an example of a voltage diagram 400 that supports memory cell read operation techniques in accordance with examples as disclosed herein. The voltage diagram 400 may be implemented by aspects of the memory device 100 or the memory array 200 as described herein, including with reference to FIGS. 1 and 2 through 3B, respectively. For example, the voltage diagram 400 may be implemented by a memory device (e.g., a memory device 100, a memory device including a memory array 200) to support reduced latency two-phase read operation techniques.

The voltage diagram 400 may depict distributions of threshold voltages of memory cells of the memory device that may be configured to store one of three supported logic states (e.g., threshold voltage distributions of ternary memory cells). For example, the voltage diagram 400 may include distributions of threshold voltages 405 that correspond to a first set of memory cells storing a first logic state, distributions of threshold voltages 410 that correspond to a second set of memory cells storing a second logic state, and distributions of threshold voltages 415 that correspond to a third set of memory cells storing a third logic state. That is, the first set of memory cells may have a threshold voltage within a distribution of threshold voltages 405 and may therefore store the first logic state, the second set of memory cells may have a threshold voltage within a distribution of threshold voltages 410 and may therefore store the second logic state, and so on.

In some examples, a magnitude of a threshold voltage for a memory cell may depend on the polarity of a voltage applied to the memory cell. For example, a first memory cell storing the first logic state may have a first threshold voltage of a first polarity (e.g., a positive polarity) within a distribution of threshold voltages 405-a of the first polarity and a second threshold voltage of a second polarity (e.g., a negative polarity) within a distribution of threshold voltages 405-*b* of the second polarity. The first threshold voltage may have a different magnitude than the second threshold voltage. Similarly, a second memory cell storing the second logic state may have a first threshold voltage of the first polarity within a distribution of threshold voltages 410-*a* and a second threshold voltage of the second polarity within a distribution of threshold voltages 410-*b* with a different magnitude than the first threshold voltage within the distribution of threshold voltages 410-*a*. A third memory cell storing the third logic state may have a first threshold voltage of the first polarity within a distribution of threshold voltages 410-*a* and a second threshold voltage of the second polarity within a distribution of threshold voltages 415-*b* with a different magnitude than the first threshold voltage within the distribution of threshold voltages 415-*a*.

The memory device may perform a two-phase (e.g., two portion, two sub-operation) read operation that leverages the polarity dependency of the threshold voltages to determine respective quantities of memory cells storing each of the three supported logic states. As part of a first phase of the read operation, the memory device may determine a quantity of memory cells storing the first logic state by applying a first sequence of voltages 420 having increasing magnitudes of the first polarity to the set of memory cells. The first sequence of voltages 420 may be associated with a first starting voltage 425 having a first magnitude 455, which may be predetermined or otherwise stored in the memory device (e.g., read from a register or look up table (LUT)). For each voltage of the first sequence of voltages 420 applied to the set of memory cells, the memory device may determine a quantity of memory cells having threshold voltages less than the applied voltage. That is, the memory device may determine the quantity of memory cells that activate (e.g., threshold) in response to application of each voltage of the first sequence of voltages 420. In some examples, the memory device may use the determined quantity of memory cells (e.g., or a quantity of memory cells that have activated up to this point in the first sequence of voltages 420) to identify a step size for the next voltage of the first sequence of voltages 420 (e.g., a magnitude of the next voltage of the first sequence of voltages 420).

The memory device may determine a total quantity of memory cells storing the first logic state based at least in part on applying an ending voltage 430 of the first sequence of voltages 420. For example, the ending voltage 430 may be a last voltage of the first sequence of voltages 420 applied to the set of memory cells as part of the first phase of the read operation. The memory device may determine that the memory cells that activated in response a voltage of the first sequence of voltages 420 (e.g., have a threshold voltage within the distribution of threshold voltages 405-*a*) store the first logic state. In some examples, the memory device may determine the ending voltage 430 based on a threshold quantity of memory cells activating in response to the first sequence of voltages 420. For example, as the memory device applies the voltages of the first sequence of voltages 420, the memory device may track a total quantity of memory cells that have been activated since application of the first starting voltage 425. If the total quantity of activated memory cells satisfies (e.g., meets or exceeds) the threshold quantity, the memory device may determine the last applied voltage to be the ending voltage 430. In some cases, the memory device may determine the ending voltage 430 based on the determined quantity. For example, if the determined quantity falls below a threshold, the memory device may determine that each memory cell having a threshold voltage within the distribution of threshold voltages 405-*a* has been read. In some examples, the memory device may determine the ending voltage 430 based at least in part on a quantity of errors detected. For example, the memory device may include error correction circuitry that may detect whether there is an error associated with a memory cell determined to store the first logic state based on activating in response to a voltage of the first sequence of voltages 420. If the quantity of errors detected satisfies (e.g., meets or exceeds) a threshold, the memory device may determine that the last applied voltage is the ending voltage 430.

As part of a second phase of the read operation, the memory device may determine a quantity of memory cells storing the third logic state by applying a second sequence of voltages 435 having increasing magnitudes of the second polarity to the set of memory cells. The memory device may determine a second starting voltage 440 having a second magnitude 460 for the second sequence of voltages. In some cases, second magnitude 460 may be different than the first magnitude 455. For each voltage of the second sequence of voltages 435 applied to the set of memory cells, the memory device may determine a quantity of memory cells having threshold voltages less than the applied voltage (e.g., the quantity of cells that activate in response to application of each voltage of the second sequence of voltages 435). In some examples, the memory device may use the determined quantity of memory cells (e.g., or a quantity of memory cells that have activated up to this point in the second sequence of voltages 435) to identify a step size for the next voltage of the second sequence of voltages 435 (e.g., a magnitude of the next voltage of the first sequence of voltages 420). In some cases, the memory device may determine an ending voltage 445 for the second sequence of voltages 435, for example, based on activation of a threshold quantity of memory cells in response to the second sequence of voltages 435, the determined quantity of memory cells falling below a threshold, a quantity of bit errors satisfying a threshold, or a combination thereof. Based on determining the ending voltage 445, the memory device may determine that each memory cell having a threshold voltage within the distribution of threshold voltages 415-*b* has been read, and accordingly may determine a total quantity of memory cells storing the third logic state.

The memory device may determine the quantity of memory cells storing the second logic state using the quantity of memory cells storing the first logic state and the quantity of memory cells storing the third logic state. For example, the quantity of memory cells storing the second logic state may correspond to (e.g., equal) the difference of the total quantity of memory cells of the memory device (e.g., the total quantity of memory cells being read as part of the read operation) and the quantity of memory cells storing the first logic state or the third logic state.

In some cases, a voltage threshold (e.g., one or both of a positive polarity voltage threshold and a negative polarity voltage threshold) for a memory cell may drift over time, which may result in an increased latency of the read operation (e.g., a time used to perform the read operation, $t_{read}$). For example, because the distribution of threshold voltages 405-*a* may drift to a higher voltage of the first polarity, the first phase of the read operation may include an increased quantity of voltages in the first sequence of voltages 420 to reach the ending voltage 430. Similarly, because the distribution of threshold voltages 415-*b* may drift to a lower voltage of the second polarity, the second phase of the read operation may include an increased quantity of voltages in the second sequence of voltages 435 to reach the ending voltage 445.

To reduce latency associated with the read operation, the memory device may use information from the first phase of the read operation, such as the ending voltage 430, to improve aspects of the second phase of the read operation. For example, the memory device may determine the second starting voltage 440 using the ending voltage 430 of the first sequence of voltages 420. For instance, the memory device may determine (e.g., compute) a magnitude of the second starting voltage 440 to be the difference of the magnitude of the ending voltage 430 and a voltage offset 450. In some cases, the voltage offset 450 may be chosen such that the magnitude of the second starting voltage 440 may be greater than the magnitude of the first starting voltage 425. In some examples, the memory device may determine the magnitude of the second starting voltage 440 based on the magnitude of the ending voltage 430. For example, different magnitudes of the ending voltage 430 may correspond to (e.g., map to) different magnitudes of the second starting voltage 440 such that the memory device may determine the magnitude of the second starting voltage 440 to be the magnitude that corresponds to the magnitude of the ending voltage 430 (e.g., read a value of the magnitude of the second starting voltage 440 from a register using the magnitude of the ending voltage 430). In some examples, the memory device may select the magnitude of the second starting voltage 440 such that it is between the magnitude of the ending voltage 430 and the first starting voltage 425.

Accordingly, the second starting voltage 440 may be closer to the end of the distribution of threshold voltages 415-b (e.g., compared with the first starting voltage 425 and the end of the distribution of threshold voltages 405-a), which may result in a lesser quantity of voltages for the second sequence of voltages 435 compared to the quantity of voltages of the first sequence of voltages 420. That is, a difference in magnitude between the second starting voltage 440 and the ending voltage 445 may be less than a difference in magnitude between the first starting voltage 425 and the ending voltage 430. As a result, fewer voltage steps may be used to reach the ending voltage 445 from the second starting voltage 440 compared to reaching the ending voltage 430 from the first starting voltage 425. Thus, the latency of the read operation may be reduced compared with a read operation using a same magnitude for the first starting voltage 425 and the second starting voltage 440.

Although the example depicted in FIG. 4 may use a positive polarity for the first sequence of voltages 420 and ending voltage 430 to determine the second starting voltage 440 having a negative polarity, those skilled in the art may appreciate that other arrangements are possible. For example, the first phase of the read operation may be associated with a sequence of voltages having a negative polarity, and the memory device may accordingly determine a positive polarity starting voltage for the second phase of the read operation using a negative polarity ending voltage of the first phase of the read operation.

Figure 5:
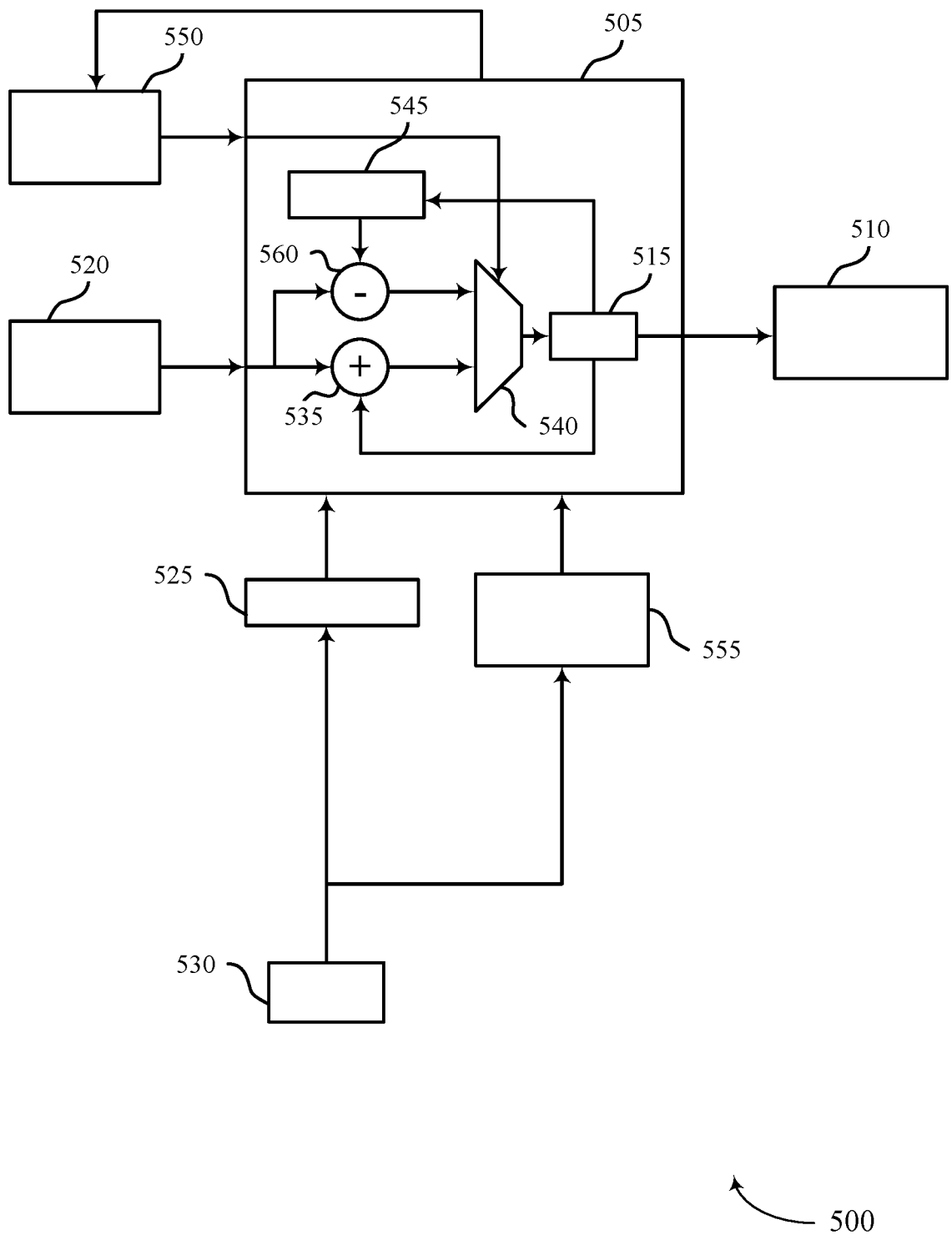
FIG. 5 illustrates an example of a system that supports memory cell read operation techniques in accordance with examples as disclosed herein.

FIG. 5 illustrates an example of a system 500 that supports memory cell read operation techniques in accordance with examples as disclosed herein. The system 500 may implement or be implemented by aspects of a memory device or a memory array as described herein, including with reference to FIGS. 1 through 4. For example, the system 500 may be implemented by (e.g., included in) a memory device (e.g., a memory device 100, a memory device including a memory array 200) to support reduced latency two-phase read operation techniques.

In some cases, the system 500 may include a logic 505 configured to determine and output a digital signal to a signal converter 510, which may be an example of a digital to analog converter (DAC). In some cases, the digital signal output by the logic 505 may be used as part of one or more phases of a read operation for a set of memory cells of a memory array coupled with the logic 505. For example, the signal converter 510 may convert the digital signal to a voltage (e.g., an analog value of a voltage) of a voltage sequence (e.g., the first sequence of voltages 420, the second sequence of voltages 435) that may be applied to the set of memory cells.

The system 500 may include a controller 550 coupled with the logic 505, which may be an example of a local memory controller 150 as described with reference to FIG. 1, to control aspects of the read operation. The system 500 may further include a set of registers 520 coupled with the logic 505. The set of registers 520 may be an example of a LUT, and may store indications of one or more step sizes for voltages sequences used for the read operation.

In some cases, the system 500 may include a sense component 530, which may be an example of the sense component 130 as described with reference to FIG. 1. The sense component 130 may be coupled with a counter 525 that is coupled with the logic 505. The counter 525 may be configured to provide an indication of a quantity of memory cells storing a particular logic state (e.g., a logic state sensed by the sense component 530) to the logic 505. For example, the counter 525 may track the quantity of memory cells determined by the sense component 530 to store the particular logic state and may output the indication to the logic 505.

In some cases, the quantity of memory cells storing the particular logic state may be used to determine or select a step size for a voltage sequence of the read operation. For example, as part of a first phase of the read operation, the logic 505 may determine and store a current voltage (e.g., a current step, a starting voltage) of a first voltage sequence in a first register 515. The first register 515 may output the current voltage (e.g., an indication of the current voltage, a digital signal representative of the current voltage) to the signal converter 510, and the current voltage may be applied to the set of memory cells to determine a quantity of memory cells having a threshold voltage less than the current voltage (e.g., a quantity of memory cells activated by the current voltage), and thus determine a quantity of memory cells storing a first logic state, for example using the sense component 530 and the counter 525. In some examples, if determining the starting voltage of the first voltage sequence, the logic 505 may read a value of the starting voltage from the set of registers 520 and output an indication of the starting voltage to the signal converter 510.

To determine a next voltage of the first voltage sequence, the logic 505 may read a step size from the set of registers 520. In some cases, the step size may depend on the quantity of activated memory cells. For example, the set of registers 520 may include or be associated with a mapping between the quantity of activated memory cells (e.g., a range of activated memory cells that includes the quantity of activated memory cells) and step sizes for the voltage sequence. The step size read from the set of registers 520 may be applied to the current voltage, for example by inputting the step size from the set of registers 520 and the current voltage from the first register 515 into a second logic 535.

The second logic 535 may be configured to add the step size to the current voltage (e.g., to increase the current voltage by the step size) to generate a next voltage (e.g., a subsequent voltage in the first voltage sequence) and output the next voltage (an indication of the next voltage, a digital signal representative of the next voltage) to a multiplexer 540. In some cases, the controller 550 may select the next voltage using the multiplexer 540 (e.g., by sending a selection signal to the multiplexer 540 that indicates for the multiplexer 540 to select and output an input received from the second logic 535), and the logic 505 may store the next voltage in the first register 515 and output an indication of the next voltage to the signal converter 510 for application to the set of memory cells.

In some cases, the logic 505 may determine an ending voltage for the first sequence of voltages. For example, if in response to the application of a voltage of the first sequence of voltages, a total quantity of memory cells activated by the first sequence of voltages satisfies a threshold quantity of memory cells, the logic 505 may determine that the first sequence of voltages has activated each memory cell of the memory device storing the first state, and thus may determine that the voltage is an ending voltage. Accordingly, the logic 505 may store the ending voltage in a second register 545 and may end the first phase of the read operation. For example, the first register 515 may output an indication of the ending voltage to the second register 545 which may store the indication of the ending voltage. In some examples, the first register 515 may be configured to output the indication of the current voltage to the second register 545. That is, at each step of the first sequence of voltages, the first register 515 may output the indication of the current voltage to the second register 545, and the second register 545 may be configured to replace a stored voltage (e.g., the previously indicated voltage) with the indicated current voltage. Thus, upon reaching the ending voltage, the first register 515 may output the indication of the current voltage, which may be the ending voltage, and the second register 545 may update a stored voltage to be the ending voltage. In some cases, upon ending the first phase of the read operation, the logic 505 may issue an indication to begin a second phase of the read operation (e.g., an indication of a completion of the first phase of the read operation) to the controller 550.

The logic 505 may use the ending voltage stored in the second register 545 to determine a starting voltage for the second phase of the read operation. For example, the logic 505 may read a voltage offset (e.g., a margin) from the set of registers 520 and may apply the voltage offset to the ending voltage. The logic 505 may input the voltage offset from the set of register 520 and the ending voltage from the second register 545 into a third logic 560. In some cases, the set of registers 520 may store multiple voltage offsets, and the voltage offset read from the set of registers 520 may depend on parameters of the read operation. For example, the set of registers 520 may include or be associated with a mapping between a magnitude of the ending voltage and a corresponding voltage offset, a mapping between a quantity of memory cells activated by the ending voltage and a corresponding voltage offset, or both. Additionally or alternatively, the voltage offset may depend on the step sizes used for the first phase of the read operation. For example, the voltage offset may depend on an average step size for the first sequence of voltages, a step size used reach the ending voltage, or a combination thereof. Additionally or alternatively, the voltage offset may correspond to (e.g., equal) a summation of one or more step sizes used in the first voltage sequence (e.g., a summation of the last two step sizes used in the first voltage sequence, among other examples).

The third logic 560 may be configured to subtract the step size from the ending voltage (e.g., to decrease the magnitude of the ending voltage by the voltage offset) to determine (e.g., generate, compute) a magnitude of the starting voltage of the second voltage sequence. The third logic 560 may output the magnitude of the starting voltage of the second voltage sequence (e.g., an indication of the difference between the ending voltage and the voltage offset) to the multiplexer 540. In some cases, in response to receiving the indication to begin the second phase of the read operation, the controller 550 may select the magnitude of the starting voltage of the second voltage sequence to be the difference between the ending voltage and the voltage offset using the multiplexer 540, for example, by transmitting an indication to determine the starting voltage of the second voltage sequence based on the ending voltage. In response, the multiplexer 540 may select to output the input received from the third logic 560 to the first register 515 for storage and application to the set of memory cells. Additionally, the logic 505 may be configured to reverse the polarity of the starting voltage of the second voltage sequence relative to the ending voltage. That is, if the first phase of the read operation uses a first polarity (e.g., a positive polarity), the logic 505 may use a second polarity (e.g., a negative polarity) for the second phase of the read operation.

Accordingly, the system 500 may perform the second phase of the read operation using the starting voltage determined using the voltage offset and ending voltage of the first phase of the read operation, which may reduce the quantity of steps of the second phase of the read operation, and thus reduce the total read latency (e.g., $t_{read}$) of the read operation.

In some examples, the controller 550 may be configured to determine whether to select the starting voltage for the second phase of the read operation calculated using the third logic 560, or to select a different starting voltage for the second phase. For example, the controller 550 may determine to use a starting voltage for the second phase which has a same magnitude of the starting voltage for the first phase of the read operation.

In some examples, the system 500 may support updating or configuring parameters used for the read operation. For example, the controller 550 may rewrite or update one or more values stored in the set of registers 520, such as mappings for one or more steps sizes stored in the set of registers 520, mappings for one or more voltage offsets stored in the set of registers 520, or both. In some cases, the controller 550 may update the voltage offset based on a temperature of the memory device that includes the set of memory cells (e.g., a temperature of the set of memory cells). For example, a higher temperature of the memory device may be associated with a larger drift of distribution of threshold voltages, while a lower temperature may be associated with a smaller drift of distribution of threshold voltages, and the controller 550 may accordingly adjust the voltage offset to compensate for the distribution of threshold voltages drifts. Additionally or alternatively, the set of registers 520 may store different voltage offset values that correspond to different temperature ranges of the memory device, and the logic 505 may read the voltage offset from the set of registers 520 that corresponds to a temperature range that includes (e.g., spans) the current temperature of the memory device.

In some examples, the system 500 may include an error control component 555, which may be an example of an error correcting code (ECC) circuit. The error control component 555 may be configured to determine whether there are errors associated with logic states of memory cells determined by the sense component 530. For example, the error control component 555 may determine whether any memory cells were incorrectly determined to store first logic state in response to the application of a voltage of the first voltage sequence. The error control component 555 may track (e.g., via a counter) the quantity of errors (e.g., the total quantity of errors determined across the voltage of the first voltage sequence, the quantity of errors determined for a particular voltage of the first voltage sequence) and output the quantity of errors to the logic 505. The logic 505 may use the quantity of errors to determine whether a last applied voltage of the first voltage sequence is the ending voltage. For example, if the quantity of errors satisfies (e.g., meets or exceeds) a threshold quantity of errors, the logic 505 may determine that the most recently applied voltage is the ending voltage of the first voltage sequence. The error control component 555 may similarly track and output the quantity of errors associated with voltage of the second voltage sequence, and the logic 505 may determine an ending voltage of the second voltage sequence based on the quantity of errors.

In some examples, the error control component 555 may compare quantity of memory cells storing a particular logic state with an expected pattern to determine whether an error exists in data read form the memory cells. For example, during a testing phase of operation of the system 500, the error control component 555 may receive an indication of logic states stored in memory cells read during a read operation, and may compare the indication with a supplied or predetermined expected pattern for the logic states. If the supplied logic states and the expected logic states do not match, or if an error control code associated with the supplied logic states and an error correction code associated with the expected pattern for the logic states do not match, the error control component 555 may determine that an error exists in the supplied logic states. In some examples, such error information may be used, for example, in setting step sizes stored in the set of registers 520, ranges of activated memory cells stored in the set of registers 520, or a combination thereof.

Figure 6:
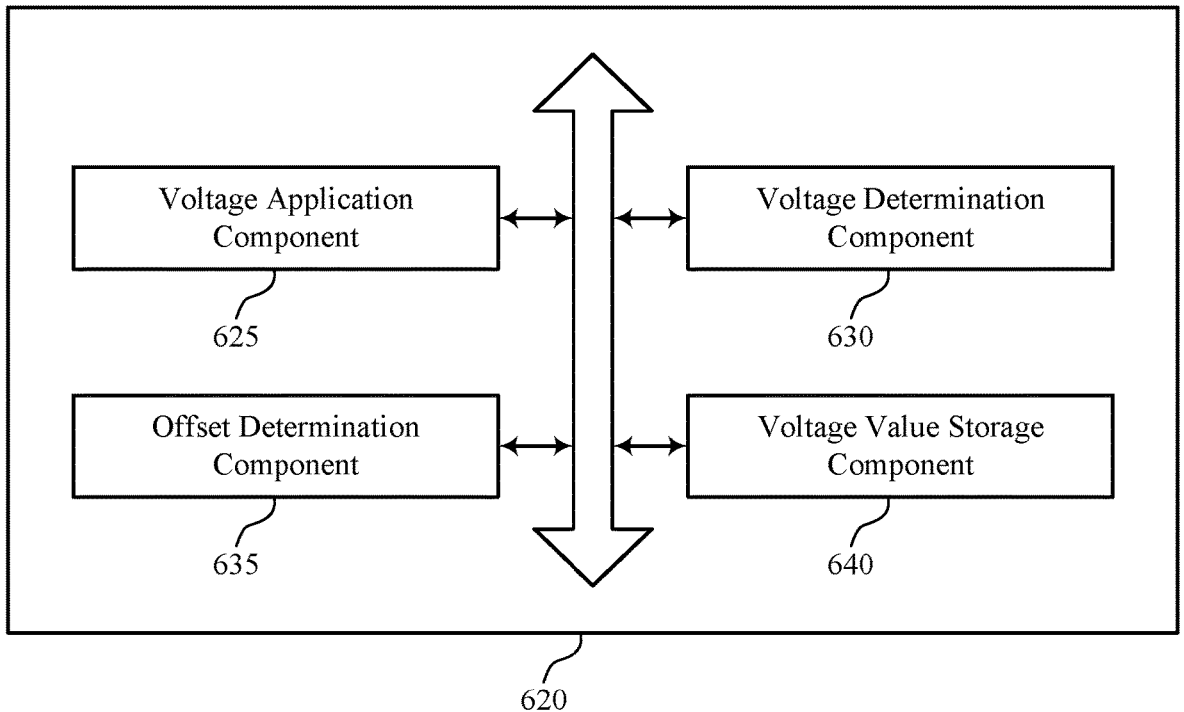
FIG. 6 shows a block diagram of a memory device that supports memory cell read operation techniques in accordance with examples as disclosed herein.

FIG. 6 shows a block diagram 600 of a memory device 620 that supports memory cell read operation techniques in accordance with examples as disclosed herein. The memory device 620 may be an example of aspects of a memory device as described with reference to FIGS. 1 through 5. The memory device 620, or various components thereof, may be an example of means for performing various aspects of memory cell read operation techniques as described herein. For example, the memory device 620 may include a voltage application component 625, a voltage determination component 630, an offset determination component 635, a voltage value storage component 640, or any combination thereof. Each of these components may communicate, directly or indirectly, with one another (e.g., via one or more buses).

The voltage application component 625 may be configured as or otherwise support a means for applying, as part of a first phase of a read operation for a set of memory cells, a first sequence of voltages having a first polarity to the set of memory cells, the first sequence of voltages associated with a first starting voltage. The voltage determination component 630 may be configured as or otherwise support a means for determining, based at least in part on an ending voltage of the first sequence of voltages, a second starting voltage associated with a second sequence of voltages having a second polarity, the second starting voltage having a magnitude different than a magnitude of the first starting voltage. In some examples, the voltage application component 625 may be configured as or otherwise support a means for applying, as part of a second phase of the read operation, the second sequence of voltages to the set of memory cells in accordance with the second starting voltage.

In some examples, to support determining the second starting voltage, the offset determination component 635 may be configured as or otherwise support a means for determining a voltage offset based at least in part on a completion of the first phase of the read operation, where the magnitude of the second starting voltage is based at least in part on the voltage offset.

In some examples, to support determining the second starting voltage, the voltage determination component 630 may be configured as or otherwise support a means for determining a difference between the ending voltage and the voltage offset, where the magnitude of the second starting voltage equals the difference between the ending voltage and the voltage offset.

In some examples, to support determining the voltage offset, the voltage value storage component 640 may be configured as or otherwise support a means for reading a value of the voltage offset from a register associated with determining voltages of a sequence of voltages associated with a phase of the read operation.

In some examples, the voltage offset is based at least in part on a step size associated with the first sequence of voltages.

In some examples, the voltage offset is based at least in part on a temperature of a memory device including the set of memory cells.

In some examples, the voltage offset is based at least in part on a magnitude of the ending voltage.

In some examples, the voltage determination component 630 may be configured as or otherwise support a means for determining, as part of the first phase of the read operation, the ending voltage based at least in part on an activation of a threshold quantity of memory cells in response to the first sequence of voltages, where determining the second starting voltage is further based at least in part on applying a voltage offset to the ending voltage.

In some examples, a quantity of the first sequence of voltages is greater than a quantity of the second sequence of voltages.

In some examples, the magnitude of the second starting voltage is greater than the magnitude of the first starting voltage.

In some examples, the first polarity corresponds to a positive voltage and the second polarity corresponds to a negative voltage.

In some examples, the set of memory cells includes ternary memory cells configured to store one of three logic states.

Figure 7:
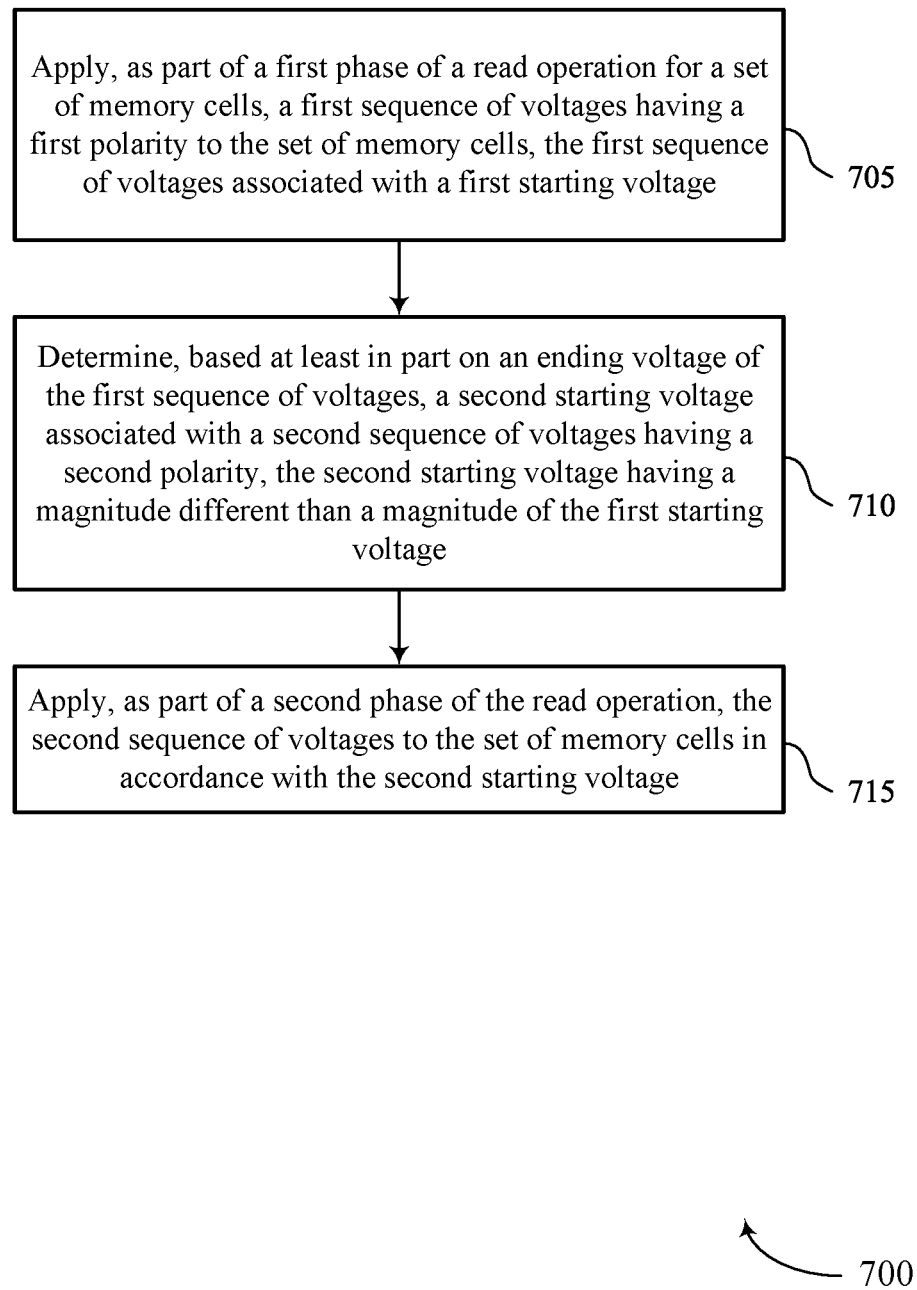
FIG. 7 shows a flowchart illustrating a method or methods that support memory cell read operation techniques in accordance with examples as disclosed herein.

FIG. 7 shows a flowchart illustrating a method 700 that supports memory cell read operation techniques in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include applying, as part of a first phase of a read operation for a set of memory cells, a first sequence of voltages having a first polarity to the set of memory cells, the first sequence of voltages associated with a first starting voltage. The operations of 705 may be performed in accordance with examples as disclosed herein. In some examples, aspects of the operations of 705 may be performed by a voltage application component 625 as described with reference to FIG. 6.

At 710, the method may include determining, based at least in part on an ending voltage of the first sequence of voltages, a second starting voltage associated with a second sequence of voltages having a second polarity, the second starting voltage having a magnitude different than a magnitude of the first starting voltage. The operations of 710 may be performed in accordance with examples as disclosed herein. In some examples, aspects of the operations of 710 may be performed by a voltage determination component 630 as described with reference to FIG. 6.

At 715, the method may include applying, as part of a second phase of the read operation, the second sequence of voltages to the set of memory cells in accordance with the second starting voltage. The operations of 715 may be performed in accordance with examples as disclosed herein. In some examples, aspects of the operations of 715 may be performed by a voltage application component 625 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying, as part of a first phase of a read operation for a set of memory cells, a first sequence of voltages having a first polarity to the set of memory cells, the first sequence of voltages associated with a first starting voltage; determining, based at least in part on an ending voltage of the first sequence of voltages, a second starting voltage associated with a second sequence of voltages having a second polarity, the second starting voltage having a magnitude different than a magnitude of the first starting voltage; and applying, as part of a second phase of the read operation, the second sequence of voltages to the set of memory cells in accordance with the second starting voltage.

Aspect 2: The method, apparatus, or non-transitory computer-readable medium of aspect 1, where determining the second starting voltage includes operations, features, circuitry, logic, means, or instructions, or any combination thereof for determining a voltage offset based at least in part on a completion of the first phase of the read operation, where the magnitude of the second starting voltage is based at least in part on the voltage offset.

Aspect 3: The method, apparatus, or non-transitory computer-readable medium of aspect 2, where determining the second starting voltage includes operations, features, circuitry, logic, means, or instructions, or any combination thereof for determining a difference between the ending voltage and the voltage offset, where the magnitude of the second starting voltage equals the difference between the ending voltage and the voltage offset.

Aspect 4: The method, apparatus, or non-transitory computer-readable medium of any of aspects 2 through 3, where determining the voltage offset includes operations, features, circuitry, logic, means, or instructions, or any combination thereof for reading a value of the voltage offset from a register associated with determining voltages of a sequence of voltages associated with a phase of the read operation.

Aspect 5: The method, apparatus, or non-transitory computer-readable medium of any of aspects 2 through 4, where the voltage offset is based at least in part on a step size associated with the first sequence of voltages.

Aspect 6: The method, apparatus, or non-transitory computer-readable medium of any of aspects 2 through 5, where the voltage offset is based at least in part on a temperature of a memory device including the set of memory cells.

Aspect 7: The method, apparatus, or non-transitory computer-readable medium of any of aspects 2 through 6, where the voltage offset is based at least in part on a magnitude of the ending voltage.

Aspect 8: The method, apparatus, or non-transitory computer-readable medium of any of aspects 1 through 7, further including operations, features, circuitry, logic, means, or instructions, or any combination thereof for determining, as part of the first phase of the read operation, the ending voltage based at least in part on an activation of a threshold quantity of memory cells in response to the first sequence of voltages, where determining the second starting voltage is further based at least in part on applying a voltage offset to the ending voltage.

Aspect 9: The method, apparatus, or non-transitory computer-readable medium of any of aspects 1 through 8, where a quantity of the first sequence of voltages is greater than a quantity of the second sequence of voltages.

Aspect 10: The method, apparatus, or non-transitory computer-readable medium of any of aspects 1 through 9, where the magnitude of the second starting voltage is greater than the magnitude of the first starting voltage.

Aspect 11: The method, apparatus, or non-transitory computer-readable medium of any of aspects 1 through 10, where the first polarity corresponds to a positive voltage and the second polarity corresponds to a negative voltage.

Aspect 12: The method, apparatus, or non-transitory computer-readable medium of any of aspects 1 through 11, where the set of memory cells includes ternary memory cells configured to store one of three logic states.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 13: An apparatus, including: a controller; an array of memory cells; and logic coupled with the controller, the logic configured to: determine, as part of a first phase of a read operation for the array of memory cells, a first starting voltage of a first sequence of voltages associated with the first phase of the read operation, the first sequence of voltages having a first polarity; output, as part of the first phase of the read operation, an indication of the first starting voltage for application to the array of memory cells; determine, as part of a second phase of the read operation and based at least in part on an ending voltage of the first sequence of voltages, a second starting voltage associated with a second sequence of voltages having a second polarity, the second starting voltage having a magnitude different than a magnitude of the first starting voltage; and output, as part of the second phase of the read operation, an indication of the second starting voltage for application to the array of memory cells.

Aspect 14: The apparatus of aspect 13, where the logic is further configured to: receive, from the controller and based at least in part on a completion of the first phase of the read operation, an indication to determine the second starting voltage based at least in part on the ending voltage.

Aspect 15: The apparatus of any of aspects 13 through 14, where the logic includes: a first register configured to output an indication of a voltage for application to the array of memory cells; and a second register coupled with the first register, the second register configured to store an indication of the ending voltage of the first sequence of voltages output by the first register, where the determination of the second starting voltage is based at least in part on the storage of the indication of the ending voltage.

Aspect 16: The apparatus of aspect 15, further including a set of registers associated with determining voltages of a sequence of voltages associated with a phase of the read operation, where the logic is further configured to: read a value of a voltage offset from a register of the set of registers, where the determination of the second starting voltage is based at least in part on the voltage offset.

Aspect 17: The apparatus of any of aspects 15 through 16, where the logic further includes: second logic configured to determine a difference between the ending voltage stored in the second register and a voltage offset; and a multiplexer configured to: receive, from the controller, an indication to determine the second starting voltage based at least in part on the ending voltage; receive, from the second logic, an indication of the difference between the ending voltage and the voltage offset; and output, to the first register, the indication of the difference between the ending voltage and the voltage offset based at least in part on the indication to determine the second starting voltage based at least in part on the ending voltage.

Aspect 18: The apparatus of aspect 17, where the logic further includes third logic configured to: determine a next voltage of a sequence of voltages associated with a phase of the read operation based at least in part on a previous voltage of the sequence and an indication of a step size; and output an indication of the next voltage to the multiplexer, where the multiplexer is configured to select the indication of the difference between the ending voltage and the voltage offset to output to the first register based at least in part on the indication to determine the second starting voltage based at least in part on the ending voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    applying, as part of a first phase of a read operation for a set of memory cells, a first sequence of voltages having a first polarity to the set of memory cells, the first sequence of voltages associated with a first starting voltage;
    determining, based at least in part on an ending voltage of the first sequence of voltages, a second starting voltage associated with a second sequence of voltages having a second polarity, the second starting voltage having a magnitude different than a magnitude of the first starting voltage; and
    applying, as part of a second phase of the read operation, the second sequence of voltages to the set of memory cells in accordance with the second starting voltage.

2. The method of claim 1, wherein determining the second starting voltage comprises:
    determining a voltage offset based at least in part on a completion of the first phase of the read operation, wherein the magnitude of the second starting voltage is based at least in part on the voltage offset.

3. The method of claim 2, wherein determining the second starting voltage comprises:
    determining a difference between the ending voltage and the voltage offset, wherein the magnitude of the second starting voltage equals the difference between the ending voltage and the voltage offset.

4. The method of claim 2, wherein determining the voltage offset comprises:
reading a value of the voltage offset from a register associated with determining voltages of a sequence of voltages associated with a phase of the read operation.

5. The method of claim 2, wherein the voltage offset is based at least in part on a step size associated with the first sequence of voltages.

6. The method of claim 2, wherein the voltage offset is based at least in part on a temperature of a memory device comprising the set of memory cells.

7. The method of claim 2, wherein the voltage offset is based at least in part on a magnitude of the ending voltage.

8. The method of claim 1, further comprising:
determining, as part of the first phase of the read operation, the ending voltage based at least in part on an activation of a threshold quantity of memory cells in response to the first sequence of voltages, wherein determining the second starting voltage is further based at least in part on applying a voltage offset to the ending voltage.

9. The method of claim 1, wherein a quantity of the first sequence of voltages is greater than a quantity of the second sequence of voltages.

10. The method of claim 1, wherein the magnitude of the second starting voltage is greater than the magnitude of the first starting voltage.

11. The method of claim 1, wherein the first polarity corresponds to a positive voltage and the second polarity corresponds to a negative voltage.

12. The method of claim 1, wherein the set of memory cells comprises ternary memory cells configured to store one of three logic states.

13. An apparatus, comprising:
a controller;
an array of memory cells; and
logic coupled with the controller, the logic configured to:
determine, as part of a first phase of a read operation for the array of memory cells, a first starting voltage of a first sequence of voltages associated with the first phase of the read operation, the first sequence of voltages having a first polarity;
output, as part of the first phase of the read operation, an indication of the first starting voltage for application to the array of memory cells;
determine, as part of a second phase of the read operation and based at least in part on an ending voltage of the first sequence of voltages, a second starting voltage associated with a second sequence of voltages having a second polarity, the second starting voltage having a magnitude different than a magnitude of the first starting voltage; and
output, as part of the second phase of the read operation, an indication of the second starting voltage for application to the array of memory cells.

14. The apparatus of claim 13, wherein the logic is further configured to:
receive, from the controller and based at least in part on a completion of the first phase of the read operation, an indication to determine the second starting voltage based at least in part on the ending voltage.

15. The apparatus of claim 13, wherein the logic comprises:

a first register configured to output an indication of a voltage for application to the array of memory cells; and
a second register coupled with the first register, the second register configured to store an indication of the ending voltage of the first sequence of voltages output by the first register, wherein the determination of the second starting voltage is based at least in part on the storage of the indication of the ending voltage.

16. The apparatus of claim 15, further comprising a set of registers associated with determining voltages of a sequence of voltages associated with a phase of the read operation, wherein the logic is further configured to:
read a value of a voltage offset from a register of the set of registers, wherein the determination of the second starting voltage is based at least in part on the voltage offset.

17. The apparatus of claim 15, wherein the logic further comprises:
second logic configured to determine a difference between the ending voltage stored in the second register and a voltage offset; and
a multiplexer configured to:
receive, from the controller, an indication to determine the second starting voltage based at least in part on the ending voltage;
receive, from the second logic, an indication of the difference between the ending voltage and the voltage offset; and
output, to the first register, the indication of the difference between the ending voltage and the voltage offset based at least in part on the indication to determine the second starting voltage based at least in part on the ending voltage.

18. The apparatus of claim 17, wherein the logic further comprises third logic configured to:
determine a next voltage of a sequence of voltages associated with a phase of the read operation based at least in part on a previous voltage of the sequence and an indication of a step size; and
output an indication of the next voltage to the multiplexer, wherein the multiplexer is configured to select the indication of the difference between the ending voltage and the voltage offset to output to the first register based at least in part on the indication to determine the second starting voltage based at least in part on the ending voltage.

19. An apparatus, comprising:
a set of memory cells; and
a controller configured to cause the apparatus to:
apply, as part of a first phase of a read operation for a set of memory cells, a first sequence of voltages having a first polarity to the set of memory cells, the first sequence of voltages associated with a first starting voltage;
determine, based at least in part on an ending voltage of the first sequence of voltages, a second starting voltage associated with a second sequence of voltages having a second polarity, the second starting voltage having a magnitude different than a magnitude of the first starting voltage; and
apply, as part of a second phase of the read operation, the second sequence of voltages to the set of memory cells in accordance with the second starting voltage.

20. The apparatus of claim 19, wherein, to determine the second starting voltage, the controller is configured to cause the apparatus to:

determine a voltage offset based at least in part on a completion of the first phase of the read operation, wherein the magnitude of the second starting voltage is based at least in part on the voltage offset.

21. The apparatus of claim 20, wherein, to determine the second starting voltage, the controller is configured to cause the apparatus to:

determine a difference between the ending voltage and the voltage offset, wherein the magnitude of the second starting voltage equals the difference between the ending voltage and the voltage offset.

22. The apparatus of claim 20, wherein, to determine the voltage offset, the controller is configured to cause the apparatus to:

read a value of the voltage offset from a register associated with determining voltages of a sequence of voltages associated with a phase of the read operation.

23. The apparatus of claim 20, wherein the voltage offset is based at least in part on a step size associated with the first sequence of voltages.

24. The apparatus of claim 20, wherein the voltage offset is based at least in part on a temperature of a memory device comprising the set of memory cells.

25. The apparatus of claim 20, wherein the voltage offset is based at least in part on a magnitude of the ending voltage.

* * * * *